United States Patent
Sato et al.

(10) Patent No.: US 6,884,300 B2
(45) Date of Patent: Apr. 26, 2005

(54) METHOD OF CLEANING A PROBE

(75) Inventors: Satoru Sato, Tokyo (JP); Akihiro Sakamoto, Tokyo (JP)

(73) Assignee: Nihon Microcoating Co., Ltd., Tokyo (JP)

(*) Notice: Subject to any disclaimer, the term of this patent is extended or adjusted under 35 U.S.C. 154(b) by 184 days.

(21) Appl. No.: 10/300,188

(22) Filed: Nov. 19, 2002

(65) Prior Publication Data

US 2004/0096643 A1 May 20, 2004

(51) Int. Cl.⁷ ................................................ B08B 7/00
(52) U.S. Cl. ............................ 134/6; 134/42; 15/210.1; 15/218; 15/218.1; 15/244.3; 15/244.4; 428/308.4; 428/319.3; 428/319.1; 428/161
(58) Field of Search ...................... 134/6, 42; 15/210.1, 15/218, 218.1, 244.3, 244.4; 428/308.4, 319.3, 319.1, 161

(56) References Cited

U.S. PATENT DOCUMENTS

| | | | | |
|---|---|---|---|---|
| 6,118,289 A | * | 9/2000 | Kitani et al. | 324/754 |
| 6,170,116 B1 | * | 1/2001 | Mizuta | 15/229.12 |
| 6,741,086 B1 | * | 5/2004 | Maekawa et al. | 324/754 |
| 2003/0089384 A1 | * | 5/2003 | Sato et al. | 134/6 |
| 2004/0083568 A1 | * | 5/2004 | Morioka et al. | 15/118 |

FOREIGN PATENT DOCUMENTS

| JP | 56-119377 | | 9/1981 |
|---|---|---|---|
| JP | 10300777 A | * | 11/1998 |
| JP | 10-339766 | | 12/1998 |
| JP | 11-337621 | | 10/1999 |
| JP | 2000-332069 | | 11/2000 |

* cited by examiner

*Primary Examiner*—Zeinab El-Arini
(74) *Attorney, Agent, or Firm*—Beyer Weaver & Thomas LLP

(57) ABSTRACT

A cleaning sheet has a base sheet, a first polishing layer formed on the base sheet, a porous foamed layer having air bubbles inside formed on the base sheet, and a second polishing layer formed on the foamed layer. The surface of the foamed layer may be flat or preferably porous with the second polishing layer having openings corresponding to those on the porous surface of the foamed layer. For cleaning a probe by using such a cleaning sheet, the tip of the probe is caused to penetrate the surface of the second polishing layer, to pass through the foamed layer and to be pressed against the first polishing layer.

4 Claims, 2 Drawing Sheets

US 6,884,300 B2

METHOD OF CLEANING A PROBE

BACKGROUND OF THE INVENTION

This invention relates to a method of removing foreign substances attached to the tip and side surfaces of a probe used for inspecting a planar target object such as a semiconductor device having integrated circuits installed thereon.

Chips are produced by installing semiconductor elements and integrated circuits on a semiconductor wafer through various wafer-producing processes. The chips thus produced on a semiconductor wafer are cut off from the wafer after a current-passing test and are packaged. Tests with a current are carried out also before and after the packaging to separate faulty products stringently from qualified products.

Such current-passing tests are carried out by means of a test apparatus of a known kind such as a wafer prober. A position-matching process by moving a prober needle ("probe") serving as an electrode of a tester and the electrodes on the chip (pads or lead lines) and a contacting process between the probe and the chip electrodes are repeated for carrying out electrical measurements of different kinds.

While such position-matching and contacting processes are repeated by moving the probe and the electrodes on the chips, the tip of the probe slides over the electrodes on the chips, scraping off portions of the electrodes. Such portions of the electrodes that have been scraped off become attached to the tip and the side surfaces of the probe as foreign substances.

The foreign substances, that thus become attached to the probe, are metals such as aluminum. If such a metal is oxidized, the electrical contact resistance between the probe and the electrodes on the chip becomes larger, making it impossible to carry out accurate electrical measurements. Thus, it is necessary to clean the tip portion of the probe regularly after each time a specified number of contact processes have been carried out in order to remove such foreign substances from the probe.

Removal of such foreign substances from the tip portion of a probe is carried out by using the same apparatus used for the current-passing tests such as the aforementioned wafer prober, except the target object to be tested such as a semiconductor wafer attached to the apparatus is replaced with a cleaning device having a similar shape. Examples of a prior art cleaning device of this kind include hard polishing plates of a grinding stone, glass and a ceramic material (as disclosed, for example, in Japanese Patent Publications Tokkai 7-199141, 5-209896, 5-166893, 4-96342 and 3-105940) and sheets with a polishing layer formed on an uneven surface of an elastic member having protrusions and indentations (as disclosed, for example, in Japanese Patent Publication Tokkai 2000-332069). The probe is pressed against the surface of such a cleaning device, as done in the aforementioned current-passing test.

If a polishing plate of a hard material is used as the cleaning device and the probe is pressed too hard against it, its tip portion will become deformed and hence it is necessary to reduce the pressure with which the probe can be pressed against the cleaning device. As a result, only the portions very close to the tip can be cleaned. If a cleaning device of the type with a polishing layer formed on an elastic member is used, on the other hand, the tip of the probe penetrates the polishing layer and cannot be cleaned sufficiently. Thus, the common practice has been to provide separately a device for cleaning the tip and another device for cleaning the side surfaces, attaching them to a current-passing test apparatus consecutively one at a time. It was therefore both cumbersome and time-consuming to clean a probe.

SUMMARY OF THE INVENTION

It is therefore an object of this invention in view of the above to provide a method of simultaneously cleaning both the tip and the side surfaces of a probe.

A cleaning sheet embodying this invention, with which the above and other objects can be accomplished, may characterized as comprising a base sheet, a first polishing layer formed on the base sheet, a porous foamed layer having air bubbles inside formed on the base sheet, and a second polishing layer formed on the foamed layer. The surface of the foamed layer may be flat or preferably porous with the second polishing layer having openings corresponding to those on the porous surface of the foamed layer.

For cleaning a probe by using such a cleaning sheet, the tip of the probe is caused to penetrate the surface of the second polishing layer, to pass through the foamed layer and to be pressed against the first polishing layer.

With the present invention, a single cleaning sheet can clean both the tip and the side surfaces of a probe. If an adhesive with a high heat resistance is used to paste the cleaning sheet of this invention to a dummy wafer, furthermore, the tip portion of a probe can be cleaned without stopping the apparatus during a current-passing inspection process.

DETAILED DESCRIPTION OF THE INVENTION

Figure 1A:
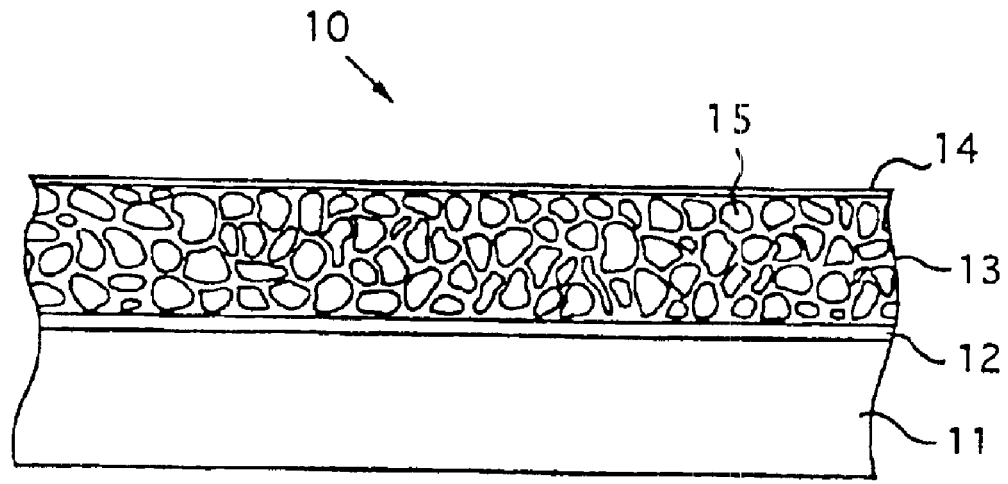
FIGS. 1A and 1B are each a sectional view of a cleaning sheet embodying this invention.
Figure 1B:
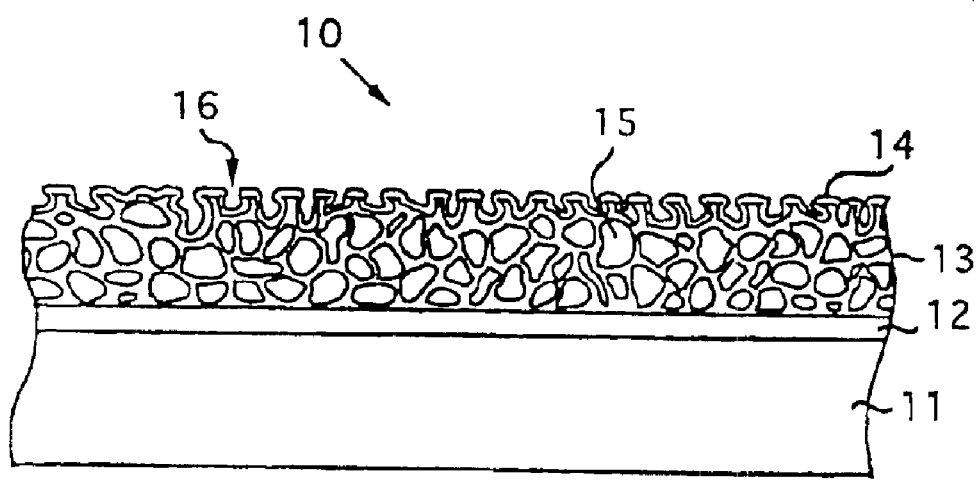
Figure 3:
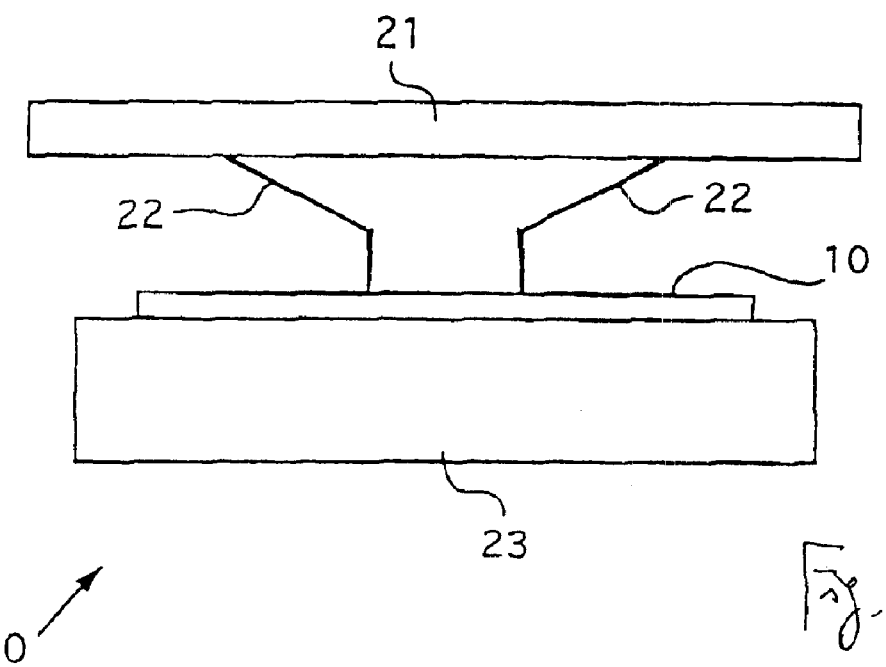
FIG. 3 is a schematic side view of a wafer prober.

FIG. 3 shows a wafer prober 20 of a known kind. When a cleaning process according to this invention is effected, a cleaning sheet 10 embodying this invention to be described below and shown in FIG. 1 is attached to such a wafer prober 20 instead of a target object such as a semiconductor wafer which is normally attached thereto in order to be inspected thereby. As shown in FIGS. 1A and 1B, the cleaning sheet 10 is comprised of a base sheet 11, a first polishing layer 12 formed on the surface of the base sheet 11, a porous foamed layer 13 having air bubbles 15 inside formed on the surface of the first polishing layer 12, and a second polishing layer 14 formed on the surface of this foamed layer 13.

A sheet with thickness 50 $\mu$m–200 $\mu$m and a flat surface of a plastic material such as polyester and polyethylene terephthalate (PET) may be used as the base sheet 11.

The first polishing layer 12 is formed by using particles of a material such as silica, aluminum oxide and diamond with average diameter of 0.001 $\mu$m–10 $\mu$m as abrading particles and fixing them by means of a polyester or urethane resin binder. Such a layer may be formed on the surface of the base sheet 11 by dispersing abrading particles inside a resin solution obtained by dissolving a resin binder with a solvent such as methylethyl ketone to prepare a polishing paint, applying this polishing paint on the surface of the base sheet 11 a known coating method such as the reverse coating method and drying the polishing paint thus applied. The thickness of the first polishing layer 12 is within the range of 10 μm–50 μm.

The foamed layer 13 is a sheet of a foamed material such as foamed urethane having a thickness within the rage of 50 μm–300 μm. This foamed sheet is pasted to the surface of the first polishing layer 12 formed on the base sheet 11. The surface of this foamed sheet may be flat as shown in FIG. 1A or may have portions removed by a buffing process to form a porous surface by causing openings 16 made of air bubbles to appear exposed on this porous surface as shown in FIG. 1B.

A foaming sheet, to be used as the foaming layer 13 with a flat surface as shown in FIG. 1A, may be formed as follows. First, a plastic sheet serving as a form-providing film with a flat and smooth surface is coated with a foaming resin solution obtained by dissolving a foaming resin material in a solvent. Foaming polyurethane resin and an organic solvent such as dimethyl formaldehyde may be used. If necessary, water, a foaming aid such as fleon and a foam stabilizer such as silicone oil may also added. After the solvent in the foaming resin solution is replaced with water inside water, this foaming resin solution is dried so as to remove the water component. Air bubbles are thereby formed where the solvent was replaced by water. The foamed layer formed on the plastic sheet is thereafter peeled off from the plastic sheet to obtain a foamed sheet. The surface at which the foamed layer was peeled off from the plastic sheet is smooth and flat, like the surface of the plastic sheet on which the foaming resin solution was applied.

The foamed sheet (forming the foamed layer 13) thus prepared is pasted to the surface of the first polishing layer 12 formed on the base sheet 11 by using a polyester or urethane resin adhesive.

Figure 2:
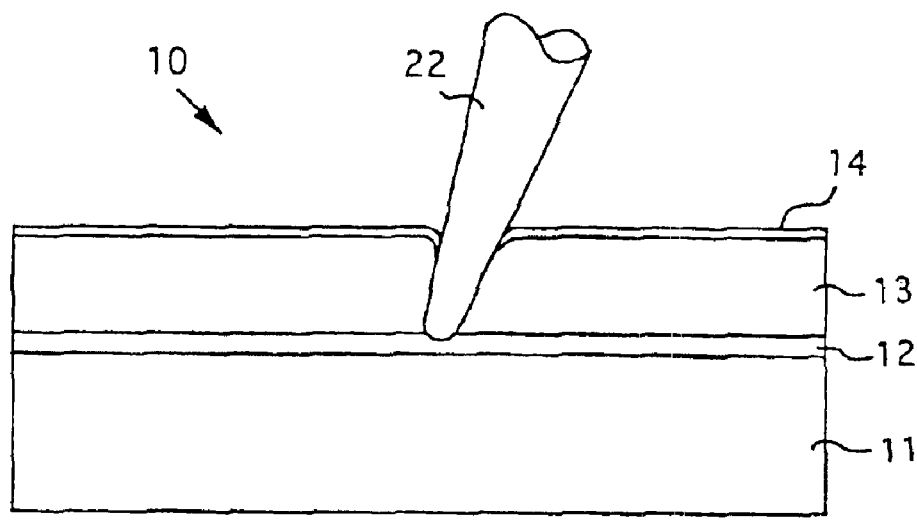
FIG. 2 is a schematic sectional view of a probe being cleaned with a cleaning sheet embodying this invention.

The second polishing layer 14 is formed by coating the surface of this foamed layer 13 with the polishing paint described above by a known coating method such as the reverse coating method and then drying it. The second polishing layer 14 is preferably formed to be thin enough to allow the probe 22 to penetrate it, as shown in FIG. 2. The thickness of the second polishing layer 14 is in the range of 10 μm–50 μm.

A probe for inspecting a planar object such as a semiconductor device with integrated circuits installed thereon may be cleaned to remove foreign substances attached to its tip and side surfaces by using a test apparatus of a known kind such as shown at 20 in FIG. 3 for carrying out a current-passing test. As shown in FIG. 3, the test apparatus 20 has a table 23 on which a target object for inspection such as a semiconductor device is intended to be attached. After such a target object for inspection is attached, the table 23 is moved horizontally and vertically for positioning and the target object is pressed against a probe 22 of a probe card 21 in order to carry out electrical measurements of different kinds on the target object. When the probe 22 is to be cleaned, the cleaning sheet 10 as described above is attached to the table 23, instead of the target object for inspection and the table 23 is similarly moved similarly to press the probe 22 against the surface of the cleaning sheet 10 attached to the table 23.

The cleaning sheet 10 may be cut into a circular, quadrangular or any other shape and pasted on the table 23 by means of a double-side adhesive sheet. Alternatively the cleaning sheet 10 may be pasted on a flat plate of an appropriate shape and this plate may then be attached to the table 23. In summary, the manner of attaching the cleaning sheet 10 onto the table 23 does not limit the scope of the invention. The cleaning sheet 10 may be attached to the table 23 or to such a flat plate by preliminarily coating the back surface of the base sheet 11 with an adhesive agent (not shown), say, to a thickness in the range of 20 μm–30 μm.

Chips on a semiconductor wafer are tested usually by varying the temperature in the range of −40° C.–150° C. and in the manner of an assembly line. The cleaning of the tip of the probe 22 is carried out according to this invention by inserting a dummy wafer of the same shape as semiconductor wafers but having a cleaning sheet of this invention pasted thereon at a regular interval in this assembly line. This method is advantageous because the tests can carried out continuously and hence more efficiently without stopping the test apparatus but when the temperature exceeds 100° C., the adhesive force of the cleaning sheet to the dummy wafer becomes adversely affected and the cleaning sheet may become displaced or peeled off. In view of such occurrences, an adhesive agent with resistance against heat such as acryl resin should preferably be used in order to stabilize the adhesive force of the cleaning sheet 10 to the dummy wafer especially under higher-temperature environment.

When the tip of the probe 22 is pressed against the surface of the cleaning sheet 10 on the table 23, it penetrates the second polishing layer 14, passes through the foamed layer 13 as shown in FIG. 2 and is pressed against the surface of the first polishing layer 12. The side surfaces of the probe 22 are cleaned while its tip is penetrating the second polishing layer 14, passing the foamed layer 13 and being pressed against the first polishing layer 12. The tip of the probe 22 is cleaned while being pressed against the surface of the first polishing layer 12.

The cleaning method explained above with reference to FIG. 2 is carried out after the test apparatus is stopped by attaching the cleaning sheet 10 at a proper place on the test apparatus. As explained above, however, this is not intended to limit the scope of the invention. The probe 22 may be cleaned during a current-passing test by pasting the cleaning sheet on a dummy wafer by using a heat-resistant adhesive agent.

As a test example, a cleaning sheet embodying this invention was produced first by coating a surface of a plastic sheet of polyethylene terephthalate (PET) with thickness 75 μm with a polishing paint having silica particles with average particle diameter of 0.3 μm dispersed in a resin solution obtained by dissolving a polyester resin in a solvent such as methylethyl ketone by the reverse coating method, forming a first polishing layer with thickness of 20 μm on the surface of the plastic sheet by drying it and aging it for three days at 40° C. Next, a foamed sheet of foamed urethane resin with thickness 100 μm was attached to the surface of this first polishing layer to form a foamed layer of thickness 50 μm on the surface of the first polishing layer and it was then aged for three days at 40° C. Next, the aforementioned polishing paint was applied on the surface of this foamed layer by the reverse coating method, dried to form a second polishing layer with thickness 10 μm and aged for 3 days at 40° C. The second polishing layer had a porous surface with openings corresponding to those on the surface of the foamed layer.

What is claimed is:

1. A method of cleaning a tip and side surfaces of a probe, said method comprising the steps of:

preparing a cleaning sheet comprising a base sheet, a first polishing layer formed on said base sheet, a porous foamed layer formed on said first polishing layer, said porous foamed layer having air bubbles inside, and a second polishing layer formed on said porous foamed layer;

causing said tip of said probe to penetrate a surface of said second polishing layer;

causing said tip to pass through said porous foamed layer; and pressing said tip against said first polishing layer wherein the side surfaces of said probe are cleaned while said tip of said probe is penetrating said second polishing layer and passes through the foamed layer.

2. The method of claim 1 wherein said porous foamed layer has a flat surface.

3. The method of claim 1 wherein said porous foamed layer has a porous surface.

4. The method of claim 3 wherein said second polishing layer has a surface with openings which correspond to openings on said porous surface of said porous foamed layer.

* * * * *

UNITED STATES PATENT AND TRADEMARK OFFICE
CERTIFICATE OF CORRECTION

PATENT NO. : 6,884,300 B2
DATED : April 26, 2005
INVENTOR(S) : Sato et al.

It is certified that error appears in the above-identified patent and that said Letters Patent is hereby corrected as shown below:

<u>Title page,</u>
Insert Item:
-- [86] PCT No.: PCT/JP02/03494
     371 Date: April 8, 2002 --.
Insert Item:
-- [30] Foreign Application Priority Data

May 21, 2001     [JP]    Japan........................ 2001-150280 --.

Signed and Sealed this

Fourth Day of October, 2005

JON W. DUDAS
*Director of the United States Patent and Trademark Office*